(12) United States Patent
Park et al.

(10) Patent No.: US 10,342,120 B2
(45) Date of Patent: Jul. 2, 2019

(54) METHOD OF MANUFACTURING DISPLAY DEVICE

(71) Applicant: LG DISPLAY CO., LTD., Seoul (KR)

(72) Inventors: Ji Sun Park, Mokpo-si (KR); Dal Jae Lee, Seoul (KR); Ji Yong Jeong, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/689,627

(22) Filed: Aug. 29, 2017

(65) Prior Publication Data

US 2017/0367173 A1 Dec. 21, 2017

Related U.S. Application Data

(62) Division of application No. 14/447,033, filed on Jul. 30, 2014, now Pat. No. 9,769,919.

(30) Foreign Application Priority Data

Jul. 30, 2013 (KR) ........................ 10-2013-0090292

(51) Int. Cl.
*H05K 1/02* (2006.01)
*H05K 1/14* (2006.01)
(Continued)

(52) U.S. Cl.
CPC ........... *H05K 1/028* (2013.01); *G02F 1/1345* (2013.01); *G02F 1/133305* (2013.01); *H01L 27/32* (2013.01); *H01L 51/0097* (2013.01); *H01L 51/5253* (2013.01); *H01L 51/56* (2013.01); *H05K 1/14* (2013.01); *H05K 1/147* (2013.01); *H01L 27/3276* (2013.01); *H01L 51/5203* (2013.01); *H01L 2251/5338* (2013.01); *H05K 2201/10128* (2013.01); *Y02E 10/549* (2013.01); *Y02P 70/521* (2015.11); *Y10T 156/1028* (2015.01)

(58) Field of Classification Search
CPC .......... H05K 1/028; H05K 1/14; H05K 1/147; H01L 51/56; H01L 51/0097; G02F 1/1345; G02F 1/1333; Y02P 70/521
See application file for complete search history.

(56) References Cited

U.S. PATENT DOCUMENTS 5,508,068 A 4/1996 Nakano
9,379,355 B1 6/2016 Lee
(Continued)

FOREIGN PATENT DOCUMENTS

CN 101996535 A 3/2011
CN 103366638 A 10/2013
(Continued)

*Primary Examiner* — Mark A Osele
*Assistant Examiner* — Christopher C Caillouet
(74) *Attorney, Agent, or Firm* — Birch, Stewart, Kolasch & Birch, LLP

(57) ABSTRACT

Discussed is a method of manufacturing a display device. The method of manufacturing the display device according to one example includes providing a first substrate including a display part, a bending part at one side of the display part, and a pad part at an end of the bending part. The method further includes providing a second substrate facing-coupled to the display part, providing a back film, and adhering the back film to a portion corresponding to the display part and the pad part on a bottom of the first substrate.

17 Claims, 5 Drawing Sheets

(51) Int. Cl.
*H01L 51/56* (2006.01)
*G02F 1/1333* (2006.01)
*H01L 27/32* (2006.01)
*H01L 51/00* (2006.01)
*H01L 51/52* (2006.01)
*G02F 1/1345* (2006.01)

(56) References Cited

U.S. PATENT DOCUMENTS

| | | |
|---|---|---|
| 2007/0132907 A1 | 6/2007 | Kim |
| 2008/0284934 A1 | 11/2008 | Umezaki et al. |
| 2009/0021666 A1 | 1/2009 | Chen |
| 2009/0148678 A1 | 6/2009 | Hwang |
| 2010/0060601 A1 | 3/2010 | Oohira |
| 2010/0302478 A1 | 12/2010 | Nakagawa et al. |
| 2011/0050657 A1 | 3/2011 | Yamada |
| 2013/0170156 A1 | 7/2013 | Jung et al. |
| 2013/0257696 A1 | 10/2013 | Ha et al. |
| 2014/0042406 A1 | 2/2014 | Degner et al. |
| 2014/0118221 A1 | 5/2014 | Park et al. |
| 2014/0118968 A1 | 5/2014 | Tanaka |
| 2014/0217382 A1 | 8/2014 | Kwon et al. |
| 2014/0233165 A1 | 8/2014 | Farkas et al. |

FOREIGN PATENT DOCUMENTS

| | | |
|---|---|---|
| DE | 31 05 981 A1 | 11/1981 |
| WO | WO 01/13166 A1 | 2/2001 |
| WO | WO 2010/070735 A1 | 6/2010 |
| WO | WO 2014/025534 A1 | 2/2014 |
| WO | WO 2014/119972 A1 | 8/2014 |

METHOD OF MANUFACTURING DISPLAY DEVICE

CROSS-REFERENCE TO RELATED APPLICATIONS

This application is a divisional of U.S. patent application Ser. No. 14/447,033 filed on Jul. 30, 2014, which claims priority under 35 U.S.C. § 119(a) to the Korean Patent Application No. 10-2013-0090292 filed on Jul. 30, 2013, all of which are hereby expressly incorporated by reference into the present application.

BACKGROUND OF THE INVENTION

Field of the Invention

The present invention relates to a display device, and more particularly, to a display device with a reduced bezel width and a method of manufacturing the same.

Discussion of the Related Art

Flat Panel Display (FPD) devices are applied to various electronic products such as portable phones, tablet PCs, notebooks, etc. The FPD devices include Liquid crystal Display (LCD) device, Plasma Display panels (PDPs), and Organic Light Emitting Display (OLED) Device, etc. Recently, Electrophoretic display (EPD) devices are widely used as the FPD devices.

In such FPD devices (hereinafter simply referred to as a display device), the LCD devices are being most widely commercialized at present because the LCD devices are easily manufactured due to the advance of manufacturing technology and realize drivability of a driver and a high-quality image.

In such FPD devices, the organic light emitting display devices have a fast response time of 1 ms or less and low power consumption, and have no limitation in a viewing angle because the organic light emitting display devices self-emit light. Accordingly, the organic light emitting display devices are attracting much attention as next generation FPD devices.

FIG. 1 is a cross-sectional view schematically illustrating a general display device.

Referring to FIG. 1, the general display device includes a display panel 10 and a panel driver 20. The display panel 10 includes a lower substrate 12 and an upper substrate 14 which are facing-coupled to each other.

The lower substrate 12 may be formed of a glass substrate, but, it may be formed of a thin and flexible substrate such as plastic. The lower substrate 12 includes a display area that includes a plurality of pixels for displaying an image, a non-display area that surrounds the display area, and a pad part that is provided in a peripheral area of one side of the lower substrate 12.

For example, a plurality of gate lines and data lines that define a plurality of pixel areas are formed to intersect each other in the display area, a thin film transistor (TFT) is formed in each area defined by the intersection of a corresponding gate line and data line, and a pixel electrode connected to the TFT is formed in each of the pixel areas. The pad part is provided in the peripheral area of the one side of the lower substrate 12 to be connected to the gate lines and the data lines, and connected to the panel driver 20.

The upper substrate 14 is formed of a thin and transparent substrate such as plastic or glass substrate, and is formed to have an area relatively less than the lower substrate 12. The upper substrate 14 is facing-coupled to a portion of the lower substrate 12 except the pad part of the lower substrate 12 by a coupling member (not shown), which is formed in a closed-loop type, in a non-display area of the lower substrate 12.

An optical film (not shown) may be adhered to a top of the upper substrate 14, in which case the optical film may have an anti-reflection function that prevents polarization and/or reflection of external light.

The panel driver 20 is connected to the pad part of the lower substrate 12, and supplies signals to the gate lines and data lines. To this end, the panel driver 20 may include a flexible circuit board 21, a driving integrated circuit (IC) 23, a control board 25, and a driving circuit part 27.

The flexible circuit board 21 is adhered to the pad part of the lower substrate 12, and bent to a bottom of the lower substrate 12 to surround a side surface of the lower substrate 12.

The driving IC 23 is mounted on the flexible circuit board 21. The driving IC 23 generates data signals and a pixel driving signal for displaying an image on the display panel 10 on the basis of image data and a timing sync signal which are supplied from the control board 25, and supplies them to the pad part.

The control board 25 is adhered to the flexible circuit board 21, and disposed at the bottom of the lower substrate 21. The control board 25 is connected to a main substrate (not shown) that generates image data and the timing sync signal which correspond to an image to be displayed by the display panel 10, and transfers the image data and timing sync signal, which are supplied from the main substrate, to the driving IC 23 through the flexible circuit board 21.

The driving circuit board 27 is mounted on the control board 25, and includes passive elements, such as a resistor, a capacitor, an inductor, and/or an IC. The driving circuit board 27 generates a voltage necessary to drive the display panel 10 and/or the driving IC 23.

The related art flexible display device described above drives the pixels of the display panel 10 according to a driving of the panel driver 20, thereby displaying a desired image on the display panel 10.

However, in the related art flexible display device, the flexible circuit board 21 configuring the panel driver 20 is bent to surround a side surface of the lower substrate 12, and thus, a portion of the flexible circuit board 21 and a bending part 21a are disposed at a side surface of the display panel 10. Therefore, a bezel width W increases due to one side of the lower substrate 12, the portion of the flexible circuit board 21, and the bending part 21a.

SUMMARY OF THE INVENTION

Accordingly, the present invention is directed to provide a display device and method of manufacturing the same that substantially obviate one or more problems due to limitations and disadvantages of the related art.

An aspect of the present invention is directed to providing a display device with a reduced bezel width and a method of manufacturing the same.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these and other advantages and in accordance with the purpose of the invention, as embodied and broadly described herein, there is provided a method of manufacturing a display device. According to one example, the method includes providing a first substrate including a display part, a bending part at one side of the display part, and a pad part at an end of the bending part. The method further includes providing a second substrate facing-coupled to the display part, providing a back film, and adhering the back film to a portion corresponding to the display part and the pad part on a bottom of the first substrate.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE INVENTION

Reference will now be made in detail to the exemplary embodiments of the present invention, examples of which are illustrated in the accompanying drawings. Wherever possible, the same reference numbers will be used throughout the drawings to refer to the same or like parts.

Hereinafter, a display device and a method of manufacturing the same according to embodiments of the present invention will be described in detail with reference to the accompanying drawings.

Figure 1:
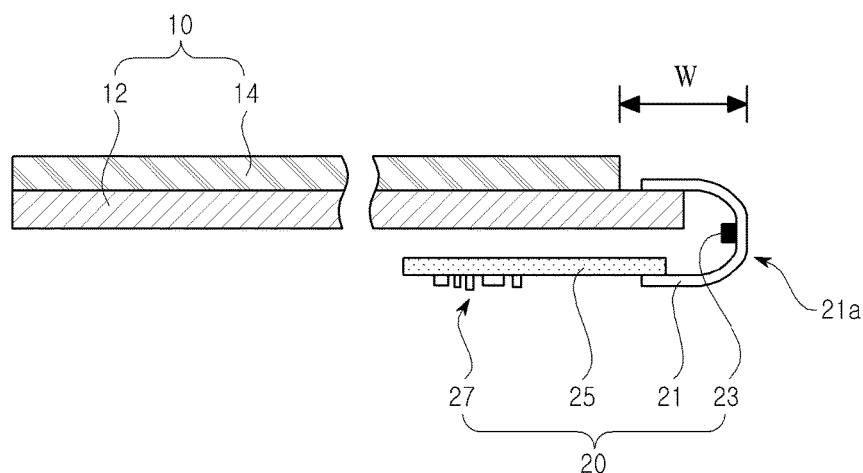
FIG. 1 is a cross-sectional view schematically illustrating a general display device.
Figure 2:
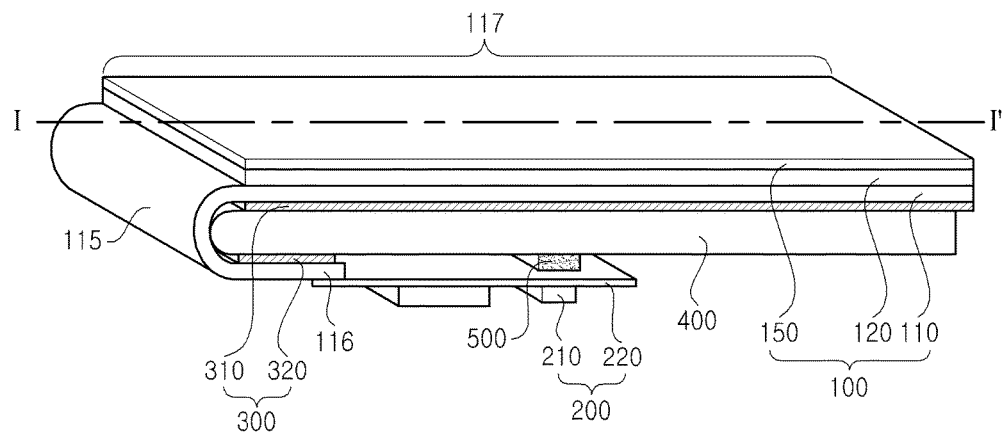
FIG. 2 is a perspective view illustrating a display device according to an embodiment of the present invention.
Figure 3:
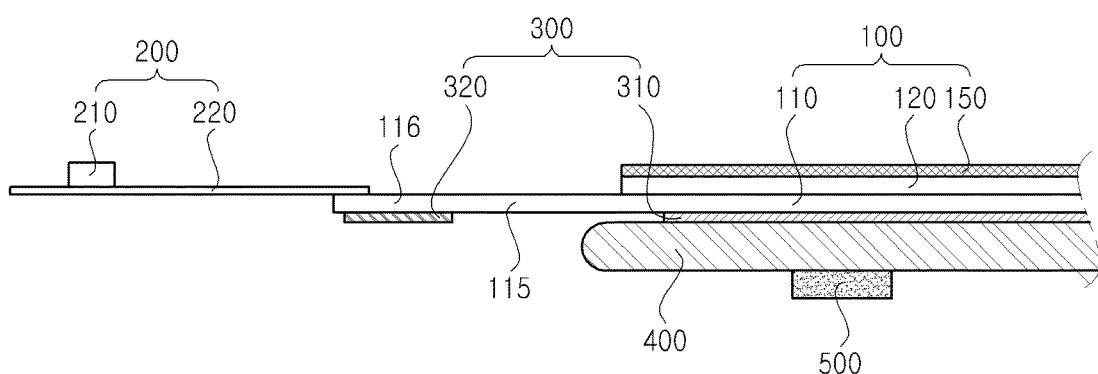
FIG. 3 is a cross-sectional view illustrating a state in which a bending part of a display panel applied to the display device according to an embodiment of the present invention is not bent.

FIG. 2 is a perspective view illustrating a display device according to the present invention, and FIG. 3 is a cross-sectional view illustrating a state in which a bending part of a display panel applied to the display device according to the present invention is not bent.

The display device according to an example of the present invention, as illustrated in FIGS. 2 and 3, include: a display panel 100 including a first substrate 110, which includes a display part 117 in which a plurality of pixels are formed, a bending part 115 formed in one side of the display part and a pad part formed in an end of the bending part 115, and a second substrate 120 facing-coupled to the first substrate 110; a back film 300 adhered to a portion corresponding to the display part 117 and the pad part 116 in a bottom of the first substrate; and a supporting member 400 supporting the back film 300 adhered to a portion corresponding to the display part 117. Here, a side of the supporting member 400 facing the bending part 115 is formed to be rounded such that the bending part 115 is guided. The term "facing-coupled" preferably means facing and coupled. All the components of the display device of the present invention are operatively coupled and configured.

First, the display panel 100 will now be described.

The display panel 100 may be formed to be flexible by using the flexible first substrate 110 and second substrate 120. In the following description, it is assumed that the display panel 100 is an organic light emitting display panel applied to a flexible organic light emitting display device that is a type of the organic light emitting display panel of the flexible display device. The display panel 100 includes the first and second substrate 110 and 120, and an optical film 150 that is formed at a top of the second substrate 120.

First, the first substrate 110 is a flexible thin film substrate, and may be formed of a plastic material or a metal foil. That is, the first substrate 110 is formed of a flexible material, and thus, as illustrated in FIGS. 2 and 3, the first substrate 110 may be bent.

For example, the first substrate 110 of a plastic material may be formed of one selected from polyimide (PI), polycarbonate (PC), polynorborneen (PNB), polyethyleneterephthalate (PET), polyethylenapthanate (PEN), and polyethersulfone (PES). The first substrate 110 includes a display part 117, the bending part 115, and the pad part 116.

The display part 117 of the first substrate 110 includes a plurality of gate lines, a plurality of data lines, a plurality of driving power lines, the plurality of pixels, and a cathode power line.

The plurality of gate lines are arranged at certain intervals to intersect the plurality of data lines, and the plurality of driving power lines are arranged in parallel to the plurality of gate lines or the plurality of data lines.

The plurality of pixels are respectively formed in a plurality of pixel areas defined by intersections between the plurality of gate lines and the plurality of data lines, and displays an image according to a gate signal from the gate lines and data signals from the respective data lines. To this end, each of the plurality of pixels includes a pixel driving circuit connected to a corresponding gate line and data line and an organic light emitting element connected to the pixel driving circuit and the cathode power line.

The pixel driving circuit includes a switching transistor connected to a corresponding gate line and data line, a driving transistor connected to the switching transistor, and a capacitor connected to a gate and source electrode of the driving transistor.

The pixel driving circuit supplies a data signal, supplied to the corresponding data line through the switching transistor which is turned on according to the gate signal supplied through the corresponding gate line, to the driving transistor to store a gate-source voltage of the driving transistor corresponding to the data signal in the capacitor.

The driving transistor is turned on with the voltage stored in the capacitor, and supplies a data current corresponding to the data signal to the organic light emitting element. Here, each of the transistors may be an a-Si thin film transistor (TFT), a poly-Si TFT, an oxide TFT, or an organic TFT.

The pixel driving circuit may further include at least one compensation transistor and at least one compensation capacitor that compensate for a threshold voltage of the driving transistor.

The organic light emitting element includes a pixel electrode (or an anode electrode) connected to the driving transistor, an organic emitting layer formed on the pixel electrode, and a cathode electrode formed on the organic emitting layer. The organic light emitting element emits light with a data current which flows from the pixel electrode to the cathode electrode according to the driving transistor being turned on, and emits light of luminance, corresponding to the data current, to on the second substrate.

The cathode power line may be provided at an entire surface of the display part to be electrically connected to the cathode electrode of each pixel, or provided in the form of patterns to be electrically connected to the respective cathode electrodes of a plurality of pixels formed on a vertical line or horizontal line of the display part. The cathode power line may be provided to be electrically connected to the organic emitting layer of each pixel, in which case the cathode electrode is not provided.

The non-display part is formed in a peripheral region of the display part 117. That is, the non-display part is arranged in the peripheral region of the display part 117 to surround the display part 117. Here, the non-display part may be defined as an area overlapping an edge portion of the second substrate 120.

A plurality of link lines which are electrically connected to the plurality of gate lines, the plurality of data lines, the plurality of driving power lines, and the cathode power line, which are provided in the display part 117, and are provided at one side of the non-display part. Here, the one side of the non-display part faces the bending part.

The bending part 115 extends from the one side of the non-display part to have a certain area, and is bent in a lower direction of the first substrate 110. That is, the bending part 115 is bent by a substrate bending apparatus to have a certain curvature, and overlaps a lower portion of one side of the second substrate 120. A plurality of extension lines electrically connected to the respective link lines are provided at the bending part 115.

The pad part 116 is electrically connected to a flexible circuit board 220 of the panel driver 200. However, the pad part 116 may be electrically connected to the driving integrated circuit (IC) 210 of the panel driver 200. That is, in FIGS. 2 and 3, the flexible circuit board 220 is electrically connected to the pad part 116, and the driving IC 210 is mounted on the flexible circuit board 220. However, the present invention is not limited thereto.

For example, the driving IC 210 may be mounted on the pad part 116 that is provided at the first substrate 110. In this case, the pad part 116 is electrically connected to the driving IC 210 instead of the flexible circuit board 220.

Second, the second substrate 120 is formed of a transparent plastic material, and formed to have an area relatively less than the first substrate 110. The second substrate 120 is facing-coupled to the first substrate 110 by a coupling member which is formed in a closed-loop type at the non-display part of the first substrate 110.

The coupling member facing-couples the first substrate 110 to the second substrate 120, and seals a space between the first substrate 110 and the second substrate 120 for protecting the organic light emitting element against external moisture or oxygen. That is, the second substrate 120 may perform a function of an encapsulating substrate (an encap) that seals the first substrate 110.

Third, the optic film 150 is formed to have a function that polarizes light and/or an anti-reflection function that prevents reflection of external light, and is adhered to the second substrate 120. However, the optic film 150 may be omitted.

Fourth, the back film 300 is adhered to the bottom of the first substrate 110, prevents a foreign material from being adhered to the bottom of the first substrate 110, and prevents light emitted from the display part 117 of the first substrate 110 from traveling in a lower direction of the first substrate 110. Moreover, the back film 300 performs a function that adheres the pad part 116 of the first substrate 110 to the bottom of the supporting member 400.

The first substrate 110 undergoes a process of forming the pixel driving circuit in a state of being mounted on a main substrate such as a glass substrate, is coupled to the second substrate 110, and is separated from the main substrate. In this case, a first substrate adhesive may have been disposed at the bottom of the first substrate 110 attached to the main substrate, and due to the first substrate adhesive, a foreign material may be easily adhered to the first substrate 110.

Therefore, the back film 300 is adhered to the bottom of the first substrate 110 separated from the main substrate. The back film 300 may be provided in a plate shape such as plastic, or provided in a film shape.

Especially, the back film 300 includes a first film 310 adhered to a portion corresponding to the display part 117 and a second film 320 adhered to a portion corresponding to the pad part 116, and the first film 310 and the second film 320 are separated from each other in an area corresponding to the bending part 115.

The first film 310 and the second film 320 are separated from each other in an area corresponding to the bending part 115, and thus, a wrinkle or an air bubble can be prevented from occurring in the back film 300 in the area corresponding to the bending part 115. Therefore, the quality of the display device may be enhanced.

A detailed configuration and function of the back film 300 will be described in detail with reference to FIG. 3.

Next, the panel driver 200 will now be described.

The panel driver 500 may be configured with the flexible circuit board 220 and the driving IC 210.

First, the flexible circuit board 220 may use a chip-on film (COF) or a flexible printed circuit (FPC), and the driving IC 210 that supplies a data signal and a gate signal (hereinafter simply referred to as a signal) for emitting light from pixels of the display panel 100 is installed in the flexible circuit board 220.

One side of the flexible circuit board 220 is electrically connected to the pad part 116 of the first substrate 110.

Second, the driving IC 210 is mounted on the flexible circuit board 220 by a chip bonding process or a surface mounting process, and bonded to a plurality of signal supply terminals and a plurality of signal input terminals.

The driving IC 210 generates data signals and a gate signal on the basis of image data and a timing sync signal which are supplied from the outside through the plurality of signal input terminals, and supplies the generated data signals and gate signal to corresponding signal supply terminals to drive the respective pixels formed in the display part of the first substrate 110, thereby displaying an image corresponding to the image data on the display part 117.

However, the panel driver 200 is not limited to the above-described configuration. That is, the panel driver 200 may be configured in various types.

The panel driver 200 according to the first embodiment, as described above, may include the flexible circuit board 220 and the driving IC 210.

The panel driver 200 according to a second embodiment may include only the driving IC 210. That is, the flexible circuit board 220 may be electrically connected to the pad part 116, and thus, the driving IC 210 may be electrically connected to the first substrate 110, or directly connected to the pad part 116 that is provided at the first substrate 110. In this case, the panel driver 200 may be configured with only the driving IC 210.

The panel driver 200 according to a third embodiment may include the flexible circuit board 220, the driving IC 210, and a plurality of driving elements that are disposed at the flexible circuit board 220 so as to supply image data and a timing sync signal, which are input from an external control board, to the driving IC 210.

The panel driver 200 according to the fourth embodiment may include the flexible circuit board 220, the driving IC 210 disposed at the flexible circuit board 220, a driving circuit board electrically connected to the flexible circuit board, and the plurality of driving elements disposed at the driving circuit board.

In addition to the above-described embodiments, the panel driver 200 may be configured in various types.

Finally, the supporting member 400 will now be described.

The supporting member 400 supports the back film 300 adhered to a portion corresponding to the display part 117, and a side of the supporting member 400 facing the bending part 115 is formed to be rounded such that the bending part 115 is guided.

That is, the supporting member 400 supports the back film 300 such that the bending part 115 is formed to be rounded.

The supporting member 400, as shown in FIG. 2, may be formed to support a whole area corresponding to the display part 117 of the back film 300 and the display panel 100, or may be formed to support an area corresponding to a portion which is adjacent to the bending part 115 of the back film 300 and the display panel 100.

The supporting member 400, of which one side is rounded, may be formed by a hemming process. That is, the supporting member 400 may be formed of a metal material such as stainless or a bendable synthetic resin, and the rounded side of the supporting member 400 may be formed by a process of bending one end of the metal material or the synthetic resin.

Moreover, the rounded side of the supporting member 400 may be formed by a process of rounding one end of the metal material or the synthetic resin.

The method of manufacturing the display device which includes the above-described elements, according to the present invention, will be briefly described with reference to FIG. 3.

First, the display panel 100 is manufactured.

Next, a back film 300 is adhered to the bottom of the first substrate 110 configuring the display panel 100. The back film 300 includes the first film 310 corresponding to the display part 117 and the second film 320 corresponding to the pad part 116, and the first film 310 and the second film 320 are separated from each other in a portion corresponding to the bending part 115.

Next, the panel driver 200 is adhered to the panel part 116.

Next, the second film 320 is adhered to the bottom of the supporting member 400.

Finally, the panel driver 200 is adhered to the bottom of the supporting member 400 by an adhesive member 500, and thus, as shown in FIG. 2, the display device according to the present invention is manufactured. As shown in FIG. 3, the adhesive member 500 may be adhered to the panel driver 200 in a state of being adhered to a bottom of the supporting member 400, or may be adhered to the bottom of the supporting member 400 in a state of being adhered to the panel driver 200.

Figure 4:
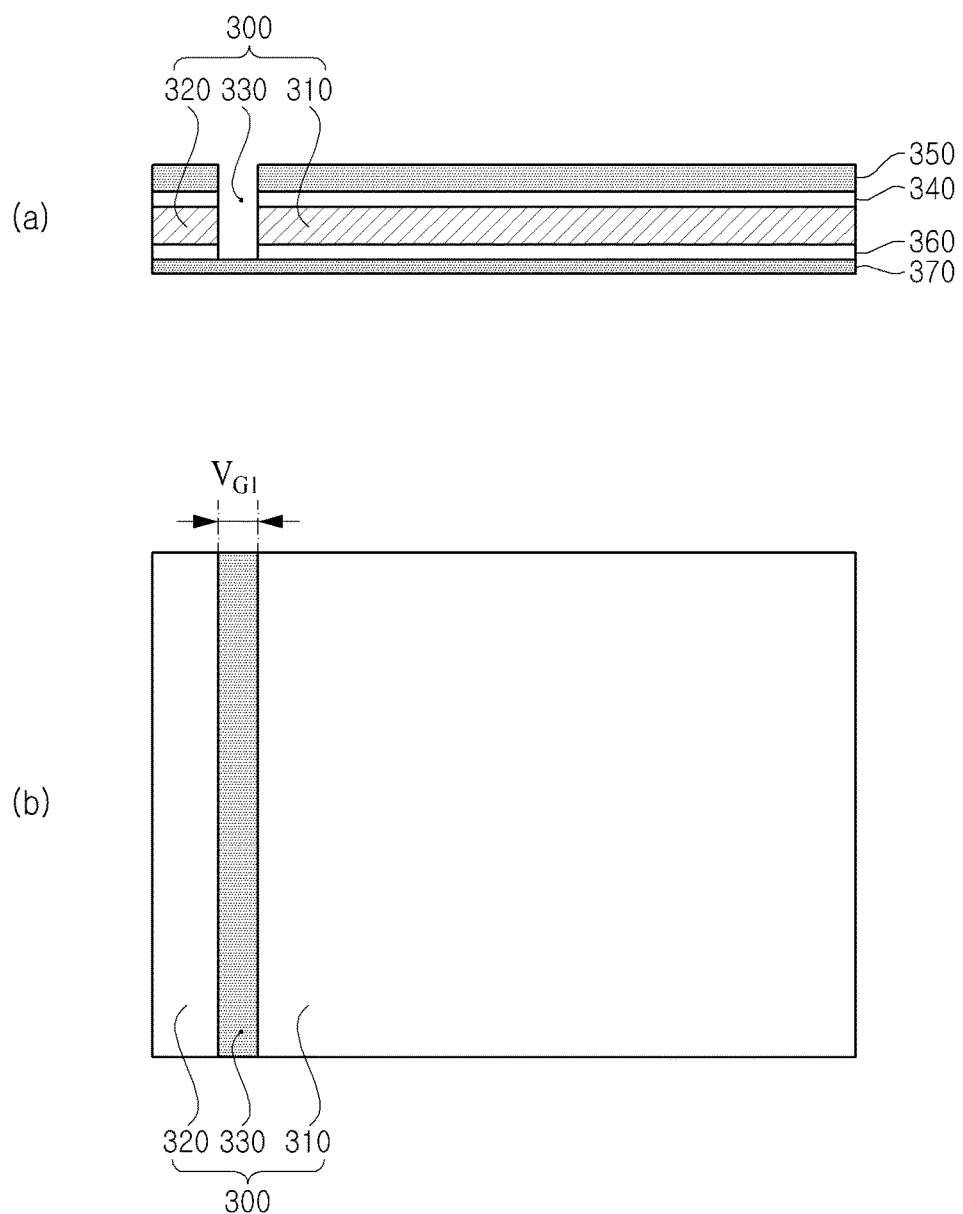
FIG. 4 is an exemplary diagram illustrating a side and a plane of the back film applied to the display device according to an embodiment of the present invention.

FIG. 4 is an exemplary diagram illustrating a side and a plane of the back film applied to the display device according to the present invention, and a portion (a) of FIG. 4 illustrates a side of the back film and a portion b of FIG. 4 illustrates a plane of the back film.

The back film 300 applied to the display device according to the present invention is adhered to a portion, corresponding to the display part 117 and the pad part 116, at a bottom of the first substrate 110.

The back film 300 includes the first film 310 adhered to a portion corresponding to the display part 117 and the second film 320 adhered to a portion corresponding to the pad part 116, and the first film 310 and the second film 320 are separated from each other in area corresponding to the bending part 115.

That is, a separation space 330 is formed in the back film and between the first film 310 corresponding to the display part 117 and the second parts 320 corresponding to the pad part 116. Here, the separation space 330 corresponds to the bending part 115.

The second film 320 adhered to a portion corresponding to the pad part 116 is adhered to the bottom of the supporting member 400.

A cross-sectional surface of the back film 300 is illustrated in a portion (a) of FIG. 4, and the plane of the back film 300 is illustrated in a portion (b) of FIG. 4. Particularly, in FIG. 4, the back film 300 which is not adhered to the display device according to the present invention is illustrated.

In this case, as described above, in the back film 300, the first film 310 and the second film 320 are disposed with the separation space 330 therebetween.

The top adhesive material 340 is disposed on tops of the first film 310 and the second film 320, and a bottom adhesive material 360 is disposed on bottoms of the first film 310 and the second film 320.

The top adhesive material 340 disposed on the top of the first film 310 adheres the top of the first film 310 to a bottom of an area corresponding to the pad part 116 of the first substrate, and the bottom adhesive material 360 disposed on the bottom of the first film 310 adheres a bottom of the first film 310 to a top of the supporting member 400.

The top adhesive material 340 disposed on a top of the second film 320 adheres a top of the second film 320 to the bottom of an area corresponding to the pad part 116, and the bottom adhesive material 360 disposed on the bottom of the second film 320 adheres a bottom of the second film 320 to the bottom of the supporting member 400.

A top release paper 350 is adhered to the top adhesive material 340, and a bottom release paper 370 is adhered to the bottom adhesive material 360.

The top release paper 350 protects the top adhesive material 340 disposed on the first film 310 and the second film 320. The bottom release paper 370 protects the bottom adhesive material 360 disposed on the first film 310 and the second film.

The top release paper 350 and the bottom release paper 370 is removed form the back film 300 immediately before the back film 300 is adhered to the first substrate 110 and the supporting member 400.

The method of manufacturing the film 300 will now be described briefly.

First, the top adhesive material 340 is disposed on a top of a mother film of the back film. Hereinafter, the mother film is referred to as a base film.

Next, the top release paper 350 is adhered to the top adhesive material 340.

Next, the bottom adhesive material 360 is disposed on a bottom of the base back film of the back film.

Next, the bottom release paper 370 is adhered to the bottom adhesive material 360.

Next, the surface of the top release paper 350, the top adhesive material 340, the back film 300 and the bottom adhesive material 360 are cut by using a cutting machine. In this case, two parts are cut to be separated from each other by a distance corresponding to a width VG of the separation space 330 such that an area corresponding to the separation space 330 is formed.

That is, the top release paper 350, the top adhesive material 340, the back film 300 and the bottom adhesive material 360 are cut at two positions by using the cutting machine.

Finally, in a cut area, the bottom adhesive elements 360, the back film 300, the top adhesive material 340 and the top release paper 350 are separated from the bottom release paper 370, and thus, the back film 300 shown in a portion (a) of FIG. 4 is formed. When the back film 300 shown in a portion (a) of FIG. 4 is seen on a plane, the first film 310 and the second film 320 are separated from each other with the separation space 330 therebetween.

That is, the present invention is applied to a display device in which a flexible first substrate 110 is bended, and enables a bended portion to be more simply formed. In the present invention, the back film 310 is divided into two areas with the separation space 330 therebetween.

The width VG of the separation space 330 is variously set according to the models, but, the width VG of the space 330 may be expressed as follows.

That is, the width VG of the space 330 is set to a value "VG=radius of curvature×bending angle+bending margin" obtained by adding a bending margin to a value which is obtained by multiplying a radius of curvature of a rounded side of the supporting member.

Hereinafter, a method of manufacturing the display device by using the back film 300 shown in FIG. 4, according to the present invention, will be described in detail.

Figure 5:
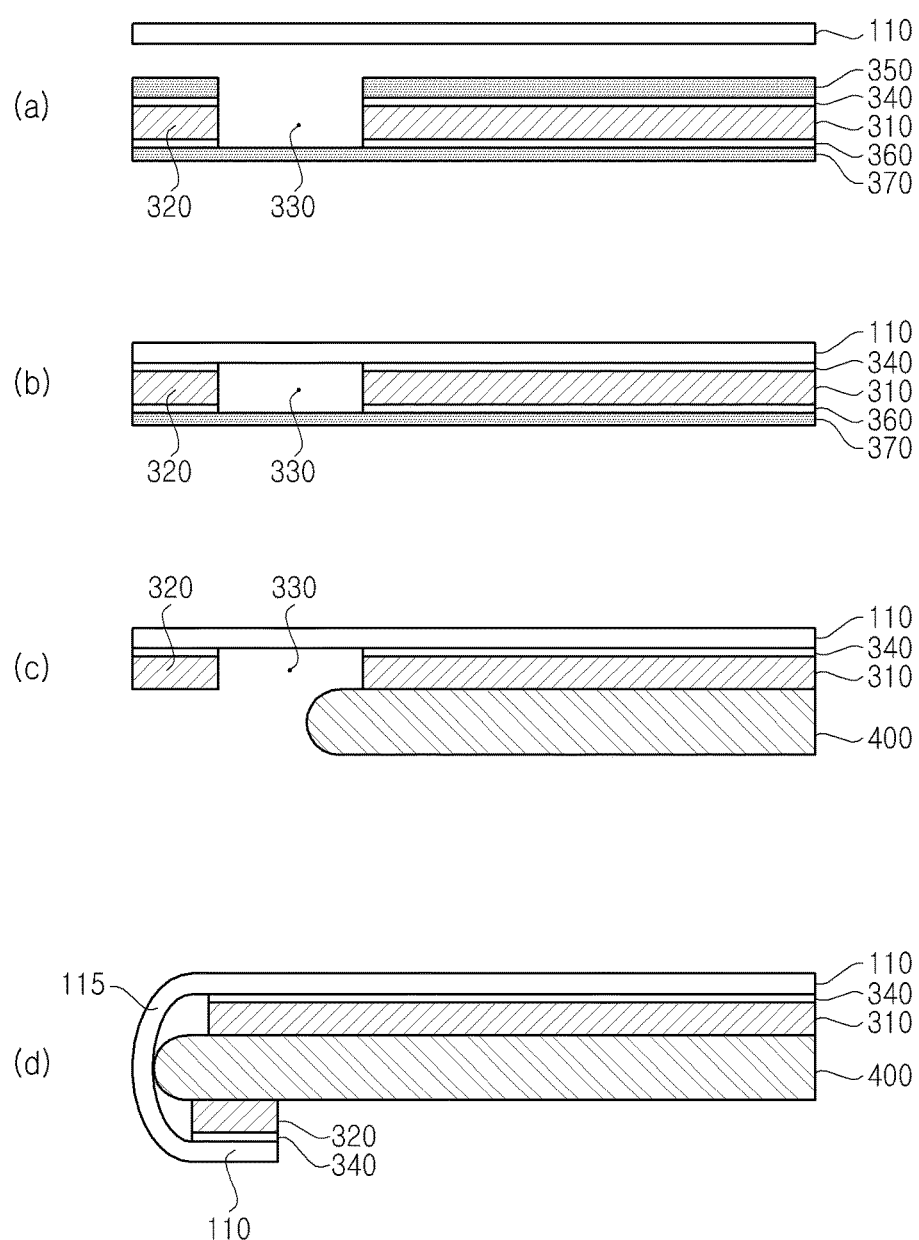
FIG. 5 is an exemplary diagram illustrating a method of manufacturing the display device according to an embodiment of the present invention.
Figure 6:
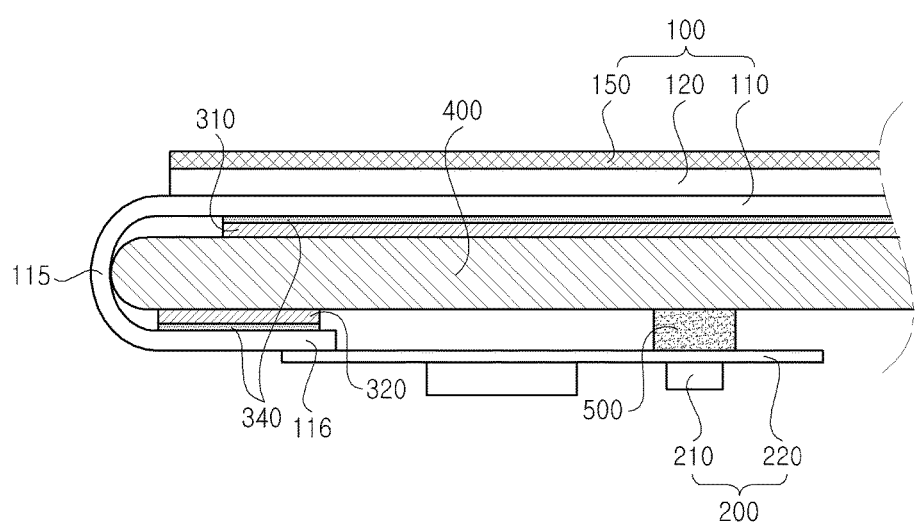
FIG. 6 is an exemplary diagram schematically illustrating a sectional view of the display device manufactured by the method of manufacturing the display device according to an embodiment of the present invention.

FIG. 5 is an exemplary diagram illustrating a method of manufacturing the display device according to the present invention, and FIG. 6 is an exemplary diagram schematically illustrating a sectional view of the display device manufactured by the method of manufacturing the display device according to the present method. Comparing with FIGS. 2 and 3, a structure of the back film 30 is illustrated in more detail in FIG. 6.

First, referring to a portion (a) of FIG. 5, the display panel 100 is manufactured by coupling the first substrate 110, which includes a plurality of pixels and in which the bending part 115 is provided at one side distal end of the first substrate 110, to the second substrate 120 facing-coupled to the first substrate 110.

Moreover, as shown in FIG. 4, a back film 300, which includes a top release paper 350 and bottom release paper 370 adhered to the back film 300 and in which the separation space 330 is formed, is manufactured.

Here, the panel driver 200 may be mounted on the pad part 116 extending from the bending part 115. When the panel driver 200 is configured with the flexible circuit board 220 and the driving IC 210, the flexible circuit board 220 is connected to the pad part 116, and the driving IC 210 is disposed at the flexible circuit board 220.

However, as described above, the driving IC 210 may be directly disposed at the pad part 116.

Moreover, the order in which the driving IC 210 is connected to the pad part 116 may be variously changed.

Next, referring to a portion (b) of FIG. 5, the top release paper 350 covering a top of the back film 300 is removed from the back film 300, and then, the back film is adhered to a bottom of the first substrate 110 by using the top adhesive material 340.

In this case, the first substrate adhesive may be disposed on the bottom of the first substrate 110. The first substrate adhesive may be an adhesive, which is used for adhering the first substrate 110 to the main substrate and remains after separating the first substrate from the main substrate, or, may be an adhesive, which is disposed additionally after separating the first substrate 110 from the main substrate.

The first film 310 and the second film 320 configuring the back film 300 may adhered to the bottom of the first substrate 110 by one-time adhesion process.

That is, as shown in FIG. 4, the first film 310 and the second film 320 are connected to each other by the bottom release paper 370, and thus, despite separation of the top release paper 350 is separated, the first film 310 and the second film 320 are continuously connected to each other by the bottom release paper 370.

Therefore, the first film 310 and the second film 320 may be adhered to the bottom of the first substrate 110 by an adhesion process.

Moreover, the first film 310 and the second film 320 are separated from each other by a separation space therebetween, which has a width VG predetermined in consideration of a radius of curvature of the supporting member 400, and thus, a separate process of arranging the first film 310 and the second film 320 in the display part 117, the bending part 115 and the pad part 116 is not needed.

That is, if the first film 310 is adhered to the bottom of the first substrate 110 such that the first film 310 matches the first film 310, the second film 320 is automatically adhered to a portion corresponding to the pad part 116, and thus, the separation space 330 is formed in an area corresponding to the bending part 115.

Next, referring to a portion (c) of FIG. 5, the first film 310 is adhered to the top of the supporting member 400 having a rounded side.

In this case, after removing the bottom release paper 370 covering the bottom of the back film 300 from the back film 300, the first film 310 is adhered to the top of the supporting member 400. Here, the bottom adhesive material 360 and the bottom release paper 370 are removed together, and the first film 310 is adhered to the top of the supporting member 400 by an adhesive which is adhered or disposed on the top of the supporting member 400.

Because the second film 320 is already adhered to a portion corresponding to the pad part 116, although the bottom adhesive material 360 and the bottom release paper 370 are removed, the second film 320 may be continuously adhered to the bottom of the first substrate 110.

Next, the bending part 115 is bended along the rounded side of the supporting member 400.

In this case, the bending part 115 may be naturally bended because the separation space 330 is formed in an area corresponding to the bending part 115.

Next, as shown in a portion (d) of FIG. 5, the pad part 116 is closely adhered to the bottom of the supporting member 400 by the second film 320.

That is, when the bending part 115 is bended as shown in a portion (d) of FIG. 5, the second film 320 adhered to the pad part 116 faces the bottom of the supporting member 400.

In this case, if the second film 320 is adhered to the bottom of the supporting member 400 by using an adhesive which is adhered or disposed on the bottom of the supporting member 400, the pad part 116 coupled to the second film 320 may be adhered to the bottom of the supporting member 400.

That is, according to the above-described present invention, the first film 310 and the second film 320 are simply adhered to the first substrate 110 and the supporting member 400.

Finally, as shown in FIG. 6, the panel driver 200 is adhered to the bottom of the supporting member 400 by the adhesive member 500, and thus, the display device according to the present invention is manufactured. However, in addition to the method shown in FIG. 6, the panel driver 200 may be adhered to the supporting member 400 by using various methods, and may be adhered to different elements instead of the supporting member 400.

The present invention will be summarized as follows.

In a related art display device, when a first substrate of a display panel is formed of a flexible substrate such as plastic for the purpose of decreasing a width of a bezel of the display panel, a first substrate adhesive and a back film are adhered to an end portion of one side of the first substrate, and the bending part is bended in certain curvature.

In this case, the first substrate and the first substrate adhesive are thin and flexible, and thus may be bended easily, and a bended state may be maintained.

However, it is difficult for the back film 400 to maintain a shape, and an air bubble and a wrinkle can occur in a surface adhered to the bending part according to a radius of a curvature of the back film 400, and thus, a quality of the display device can be degraded.

To solve such problems, in another related art display device, the back film is not adhered to the bending part, and is only adhered to a top of the supporting member. In this case, a first substrate adhesive should be used for adhering the first substrate to the bottom of the supporting member. However, due to a low adhesive power and a crack of the first substrate adhesive, the first substrate adhesive is not be adhered to the supporting member well, and for this reason, a process of adhering a separate adhesive such as a stiffener to an end of the first substrate is needed. Therefore, a new process should be added to the method of manufacturing the display device.

According to the present invention provided for solving these problems, in the back film 300 adhered between the display panel 100 and the supporting member 400, in a portion corresponding to the bending part 115 of the display panel, a separation space is formed, and thus, the back film can be easily adhered to the display panel 100 and the supporting member 400. Therefore, the number of processes for manufacturing the display device can be reduced, and it is possible to solve a problem which occurs in an aligning process. That is, the number of process can be reduced, and the aligning process can be easily performed by replacing the stiffener with the back film.

According to the present invention, the bending part of the first substrate configuring the display panel is directly bent in a bottom direction of the display panel, and the pad part extending from the bending part is disposed at the bottom of the display panel, thus decreasing the bezel width of the display panel.

Moreover, according to the present invention, due to the rounded side surface of the supporting member disposed at the bottom of the display panel, the bending part of the first substrate is naturally folded with the bending part having a curved surface, and thus, the plurality of circuits provided at the bending part can be prevented from being damaged.

Moreover, according to the present invention, a separation space is formed in a portion corresponding to the bending part of the back film which is adhered between a bottom of the first substrate configuring the display panel and the supporting member to protect a bottom of the display panel, and thus, stress is not applied to the back film.

Moreover, according to the present invention, the back film may be adhered to the bottom of the first substrate by one-time process, and thus, the number of processes for manufacturing the display device can be reduced.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method of manufacturing a display device, the method comprising:
    providing a first substrate including a display part, a bending part at one side of the display part, and a pad part at an end of the bending part;
    providing a second substrate facing the display part;
    providing a back film including a first film part and a second film part,
    wherein the first and second film parts are separated from each other by a separation space which corresponds to the bending part of the first substrate, and
    wherein a top adhesive material is disposed on tops of the first film part and the second film part, and a bottom adhesive material is disposed on bottoms of the first film part and the second film part; and
    adhering the back film to a portion corresponding to the display part and the pad part on a bottom of the first substrate, using the top adhesive material.

2. The method of claim 1, wherein a plurality of pixels are formed in the display panel.

3. The method of claim 1, wherein the providing the back film comprises:
    applying the top adhesive material to a top of a base back film;
    adhering a top release layer to a surface of the top adhesive material;
    adhering the bottom adhesive material to the base back film;
    adhering a bottom release layer to a surface of the bottom adhesive layer; and
    cutting out a portion corresponding to the bending part except the bottom release layer to manufacture the back film.

4. The method of claim 3, wherein the adhering the back film to the portion corresponding to the display part and the pad part of the first substrate comprises:
    separating the top release layer; and
    adhering a top of the back film to the bottom of the first substrate by using the top adhesive material.

5. The method of claim 1, further comprising:
    adhering a top of a supporting member to a bottom of a portion of the back film, the portion of the back film corresponding to the display part.

6. The method of claim 5, wherein the providing the back film comprises:
applying the top adhesive material to a top of a base back film;
adhering a top release layer to a surface of the top adhesive material;
adhering the bottom adhesive material to the base back film;
adhering a bottom release layer to a surface of the bottom adhesive layer; and
cutting out a portion corresponding to the bending part except the bottom release layer to provide the back film.

7. The method of claim 6, wherein the adhering the top of the supporting member to the bottom of the portion of the back film comprises:
separating the bottom release layer; and
adhering the bottom of the portion of the back film to the top of the supporting member, the portion of the back film corresponding to the display part.

8. The method of claim 7, wherein the bottom of the portion of the back film is adhered to the top of the supporting member by an adhesive which is adhered or disposed on the top of the supporting member.

9. The method of claim 7, wherein the bottom of the portion of the back film is adhered to the top of the supporting member by the bottom adhesive material.

10. The method of claim 5, further comprising:
bending the bending part of the first substrate along a side of the supporting member; and
adhering a portion of the back film, corresponding to the pad part, to a bottom of the supporting member.

11. The method of claim 10, wherein the providing the back film comprises:
applying the top adhesive material to a top of a base back film;
adhering a top release layer to a surface of the top adhesive material;
adhering the bottom adhesive material to the base back film;
adhering a bottom release layer to a surface of the bottom adhesive layer; and
cutting out a portion corresponding to the bending part except the bottom release layer to manufacture the back film.

12. The method of claim 11, wherein the portion of the back film, which corresponds to the pad part, is adhered to the bottom of the supporting member by an adhesive which is adhered or disposed on the bottom of the supporting member.

13. The method of claim 11, wherein the portion of the back film, which corresponds to the pad part, is adhered to the bottom of the supporting member by the bottom adhesive material.

14. A method of providing a display device, the method comprising:
providing a flexible first substrate including a display part, a bending part at one side of the display part, and a pad part at one side of the bending part;
providing a second substrate facing the display part;
providing a back film;
adhering the back film to a portion corresponding to the display part and the pad part on a bottom of the first substrate;
providing a supporting member disposed below a portion of the back film corresponding to the display part, wherein the supporting member is not bent; and
bending the bending part of the first substrate along a side of the supporting member.

15. The method of claim 14, wherein the providing the back film comprises:
adhering a bottom adhesive layer to a base back film;
adhering a bottom release layer to a surface of the bottom adhesive layer; and
cutting out a portion of the bottom adhesive layer corresponding to the bending part.

16. The method of claim 15, wherein in the providing the supporting member, the bottom release layer is removed.

17. A method of manufacturing a display device, the method comprising:
providing a first substrate including a display part, a bending part at one side of the display part, and a pad part at an end of the bending part;
providing a second substrate facing-coupled to the display part;
providing a back film, wherein the providing the back film comprises:
applying a top adhesive material to a top of a base back film,
adhering a top release paper to a surface of the top adhesive material,
adhering a bottom adhesive material to the base back film,
adhering a bottom release paper to a surface of the bottom adhesive paper, and
cutting a portion corresponding to the bending part except the bottom release paper to manufacture the back film; and
adhering the back film to a portion corresponding to the display part and the pad part on a bottom of the first substrate.

* * * * *